United States Patent
Kawaguchi et al.

(10) Patent No.: US 6,242,161 B1
(45) Date of Patent: Jun. 5, 2001

(54) ACRYLIC COPOLYMER AND REFLECTION-PREVENTING FILM-FORMING COMPOSITION CONTAINING THE SAME

(75) Inventors: Kazuo Kawaguchi; Akio Saito; Shin-ichiro Iwanaga, all of Yokkaichi (JP)

(73) Assignee: JSR Corporation, Tokyo (JP)

(*) Notice: Subject to any disclaimer, the term of this patent is extended or adjusted under 35 U.S.C. 154(b) by 0 days.

(21) Appl. No.: 09/320,450

(22) Filed: May 27, 1999

(30) Foreign Application Priority Data

May 29, 1998 (JP) .................................. 10-165880
May 10, 1999 (JP) .................................. 11-129150

(51) Int. Cl.$^7$ ............................. G03F 7/11; G03F 7/38; G03C 1/76; C08L 33/04; C08L 33/08; C08L 33/10

(52) U.S. Cl. ......................... 430/313; 430/314; 430/330; 428/41.5; 428/41.7; 525/330.3; 525/330.4; 525/330.5; 525/330.6; 526/245

(58) Field of Search ............................. 430/270.1, 322, 430/326, 325, 330, 311, 313, 314, 271.1; 525/154, 330.3, 330.4, 330.5, 330.6; 428/41.5, 41.7; 526/245

(56) References Cited

U.S. PATENT DOCUMENTS

| | | | |
|---|---|---|---|
| 5,410,005 | * 4/1995 | Nemoto et al. | 526/245 |
| 5,820,957 | * 10/1998 | Schroeder et al. | 428/40.1 |
| 5,830,623 | * 11/1998 | Maruyama et al. | 430/322 |
| 5,886,102 | 3/1999 | Sinta et al. | 525/154 |
| 6,033,830 | * 3/2000 | Sinta et al. | 430/325 |

FOREIGN PATENT DOCUMENTS 10-204328  8/1998 (JP).

* cited by examiner

Primary Examiner—Shean C. Wu

(74) Attorney, Agent, or Firm—Piper Marbury Rudnick & Wolfe, LLP; Steven B. Kelber

(57) ABSTRACT

A reflection-preventing film-forming composition including a copolymer having structural units represented by the following general formulas (1) and (2) and a solvent:

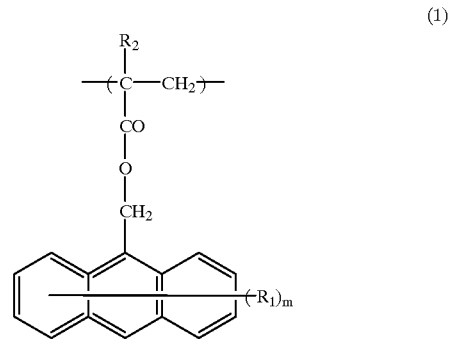

(1)

wherein $R_1$ represents a hydrogen atom, a halogen atom, a hydrocarbon group, etc.; $R_2$ represents a hydrogen atom or a methyl group; and m represents an integer of 1 to 9;

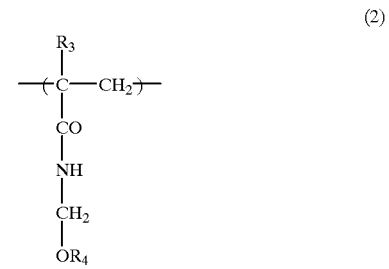

(2)

wherein $R_3$ represents a hydrogen atom or a methyl group, and $R_4$ represents a hydrogen atom or an organic group. Reflection-preventing films formed of this composition have a high reflection-preventing effect, may cause no intermixing with the resist, have a high etching rate and also can form a resist pattern having superior resolution and precision.

13 Claims, 2 Drawing Sheets

ACRYLIC COPOLYMER AND REFLECTION-PREVENTING FILM-FORMING COMPOSITION CONTAINING THE SAME

BACKGROUND OF THE INVENTION

1. Field of the Invention

This invention relates to a novel acrylic copolymer, and a reflection-preventing film-forming composition containing the same which composition is useful in fine processing in lithographic processes making use of radiations of various types and is especially suited for the fabrication of integrated circuit devices.

2. Description of the Prior Art

In processes for fabricating integrated circuit devices, the processing size in lithography is being made finer in order to attain a higher integration. In such lithography, a resist composition is coated on a substrate, and a mask pattern is transferred by means of a demagnification projection exposure system (a stepper), followed by development with a suitable developing solution to form the desired pattern. However, substrates of aluminum, an aluminum-silicon alloy, an aluminum-silicon-copper, polysilicon and tungsten silicide used in this process, having a high reflectance, necessarily reflect from their surfaces the radiations made incident thereon. This may cause halation in the resist pattern to cause a problem that any fine resist pattern can not accurately be reproduced.

In order to solve such a problem, it is proposed that a reflection-preventing film having properties of absorbing radiations reflected from the substrate is formed beneath a resist film to be formed on the substrate.

Such a reflection-preventing film is first of all known to include inorganic films such as a titanium film, a titanium dioxide film, a titanium nitride film, a chromium oxide film, a carbon film or an α-silicon film which are formed by a process such as vacuum deposition, CVD (chemical vapor deposition) or sputtering. These inorganic reflection-preventing films, however, are electrically conductive and hence have disadvantages that they can not be used in the manufacture of integrated circuits and the formation of reflection-preventing films requires a special system such as a vacuum deposition system, a CVD system or a sputtering system. In order to solve the disadvantage inherent in the inorganic reflection-preventing films, an organic reflection-preventing film is proposed which is formed of, e.g., a polyamide acid (co)polymer or a polysulfone (co)polymer and a dye (see Japanese Pre-examination Patent Publication (Kokai) No. 59-93448) (the term (co)polymer is herein meant to embrace a polymer and a copolymer). This reflection-preventing film is not electrically conductive and also is soluble in suitable solvents, and hence can be formed by coating on a substrate in the state of a solution, like a resist, without requiring any special system.

However, the reflection-preventing film formed of a polyamide acid (co)polymer or a polysulfone (co)polymer and the resist may mix with each other (this is called intermixing), though slightly, to cause deterioration of resist pattern shape, e.g., poor clearing and trailing, thus there remains a problem. Also, with an increasing demand for making integrated circuits finer, resists are sought to be made more thin-film, but the above reflection-preventing film has a disadvantage that it is etched at so low a rate (hereinafter "etching rated") that long-term irradiation with plasma gas is required in the step of removing the underlying reflection-preventing film by dry etching, so that the resist layer coated in a small thickness may also be corroded simultaneously to cause a serious film thickness loss of the resist layer consequently.

SUMMARY OF THE INVENTION

Accordingly, an object of the present invention is to provide a reflection-preventing film-forming composition which can overcome the problems the prior art has had, and which has a high reflection-preventing effect, may cause no intermixing, has a high etching rate and can form a resist pattern having superior resolution and precision, and a process of forming a resist pattern.

The reflection-preventing film-forming composition of the present invention is a reflection-preventing film-forming composition comprising a copolymer having structural units represented by the following general formulas (1) and (2) and a solvent.

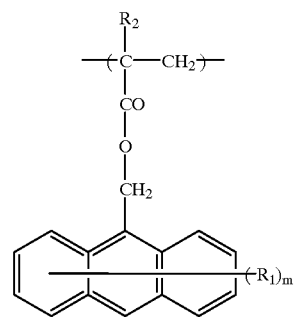

(1)

wherein $R_1$ represents a hydrogen atom, a halogen atom, a hydrocarbon group having 1 to 6 carbon atoms, a nitro group, a primary amino group, a hydroxyl group, an acyl group, a carboxyl group, a sulfone group or a mercapto group, and, when present in plurality, $R_1$'s may be the same or different; $R_2$ represents a hydrogen atom or a methyl group; and m represents an integer of 1 to 9.

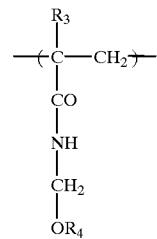

(2)

wherein $R_3$ represents a hydrogen atom or a methyl group, and $R_4$ represents a hydrogen atom or an organic group.

The reflection-preventing film-forming composition of the present invention has a high reflection-preventing effect, may cause no intermixing with the resist, has a high etching rate and also, in cooperation with a positive or negative resist, can form a resist pattern having superior resolution and precision. Thus, the present composition contributes greatly especially to the manufacture of integrated circuits having a high integration.

DETAILED DESCRIPTION OF THE PREFERRED EMBODIMENTS

Figure 1:
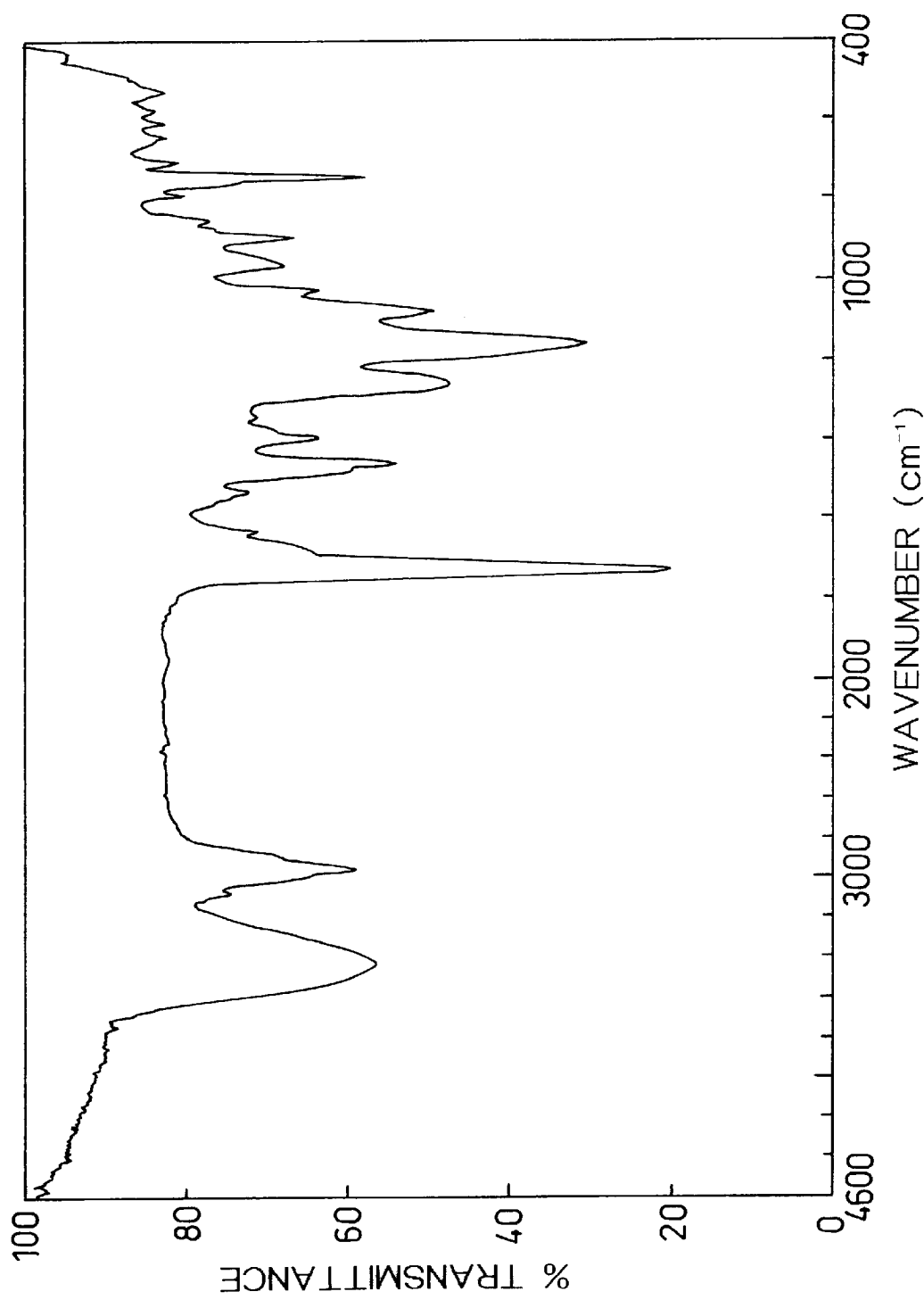
FIG. 1 shows an infrared absorption spectrum of a copolymer obtained in Polymerization Example 1.

The present invention will be described below in detail.

In the following description, the terms (meth)acrylic acid, (meth)acrylic ester, and (meth)acryl amide, (meth)acryloyl are used in the meaning that they embrace acrylic acid and methacrylic acid, acrylic ester and methacrylic ester, acryl amide and methacryl amide, and acryloyl and methacryloyl, respectively.

Copolymer

In the reflection-preventing film-forming composition of the present invention, the copolymer has a structural unit represented by the general formula (1):

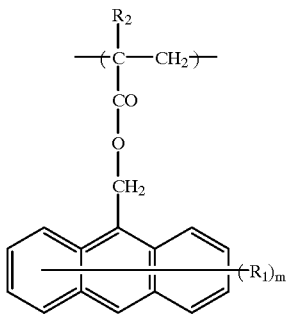

(1)

wherein $R_1$, $R_2$ and m are as defined previously.

$R_1$ represents a hydrogen atom, a halogen atom, a hydrocarbon group, a nitro group, a primary amino group, hydroxyl group, a phenyl group, an acyl group, a carboxyl group, a sulfone group or a mercapto group. The hydrocarbon group may include alkyl groups having 1 to 6 carbon atoms, alkenyl groups and aryl groups. The alkyl groups may preferably be straight-chain alkyl groups having 1 to 6 carbon atoms or branched alkyl groups having 3 to 6 carbon atoms, including as specific examples a methyl group, ethyl group, a propyl group, an isopropyl group, a n-butyl group and a t-butyl group. The alkenyl groups may preferably be alkenyl groups having 2 to 6 carbon atoms, including as specific examples a vinyl group, propenyl group and a butenyl group. The halogen atoms may preferably include, e.g., fluorine, chlorine and bromine. The acyl group may preferably be aliphatic or aromatic acyl groups having 1 to 6 carbon atoms, specifically including a formyl group, an acetyl group and a phenacyl group.

The structural unit represented by the general formula (1) is derived from an anthracene-nucleus-containing (meth) acrylic ester monomer represented by the following general formula (3):

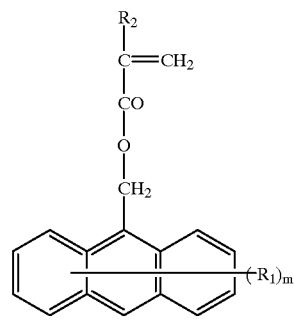

(3)

wherein $R_1$, $R_2$ and m are as defined in the general formula (1).

The anthracene-nucleus-containing (meth)acrylic ester monomer represented by the general formula (3) is obtained by, e.g., allowing an anthracene methanol compound represented by the formula:

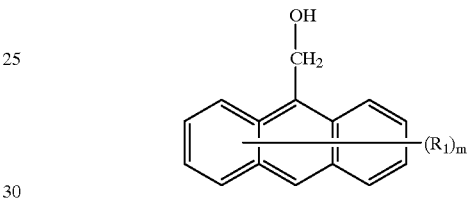

(wherein $R_1$ and m are as defined previously); to react with a (meth) acrylic chloride in the presence of a basic compound in an organic solvent. The basic compound may include, e.g., triethylamine and pyridine. As the organic solvent, usable are, e.g., solvents capable of dissolving a reflection-preventing film material described later, preferably including propylene glycol monoalkyl ethers.

The anthracene-nucleus-containing (meth)acrylic ester represented by the general formula (3) may include, e.g., 9-anthracene methanol (meth)acrylic ester; alkyl-substituted 9-anthracene methanol (meth)acrylic esters such as 1-methyl-9-anthracene methanol (meth)acrylic ester, 2-methyl-9-anthracene methanol (meth)acrylic ester, 1-ethyl-9-anthracene methanol (meth)acrylic ester and 2-ethyl-9-anthracene methanol (meth)acrylic ester; halogen-substituted 9-anthracene methanol (meth)acrylic esters such as 1-chloro-9-anthracene methanol (meth)acrylic ester, 2-chloro-9-anthracene methanol (meth)acrylic ester, 1-bromo-9-anthracene methanol (meth)acrylic ester and 2-bromo-9-anthracene methanol (meth)acrylic ester; nitro-substituted 9-anthracene methanol (meth)acrylic esters such as 1-nitro-9-anthracene methanol (meth)acrylic ester and 2-nitro-9-anthracene methanol (meth)acrylic ester; amino-substituted 9-anthracene methanol (meth)acrylic esters such as 1-amino-9-anthracene methanol (meth)acrylic ester and 2-amino-9-anthracene methanol (meth)acrylic ester; hydroxy-substituted 9-anthracene methanol (meth)acrylic esters such as 1-hydroxy-9-anthracene methanol (meth) acrylic ester and 2-hydroxy-9-anthracene methanol (meth) acrylic ester; and acyl-substituted 9-anthracene methanol (meth)acrylic esters such as 1-acetyl-9-anthracene methanol (meth) acrylic ester and 2-acetyl-9-anthracene methanol (meth)acrylic ester. Any of these monomers may be used alone or in the form of a mixture of two or more, depending on the properties desired for the reflection-preventing film. Of these compounds, 9-anthracene methanol (meth)acrylic ester is preferably used.

The copolymer used in the present invention has another essential structural unit represented by the following general formula (2):

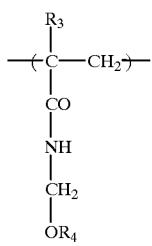

(2)

wherein $R_3$ and $R_4$ are as defined previously.

$R_4$ represents a hydrogen atom or an organic group. The organic group may include, e.g., alkyl groups. The alkyl groups may preferably include straight-chain or branched alkyl groups having 1 to 6 carbon atoms, as specifically exemplified by a methyl group, an ethyl group, a propyl group, an isopropyl group, a n-butyl group and a t-butyl group.

The structural unit represented by the general formula (2) is derived from a (meth)acrylamide derivative monomer represented by the following general formula (4):

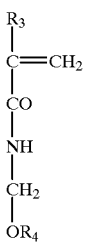

(4)

wherein $R_3$ and $R_4$ are as defined previously.

Of the (meth)acrylamide derivative represented by the formula (4), a compound in which $R_4$ is the hydrogen atom can readily be obtained by, e.g., allowing a (meth) acrylamide represented by the formula:

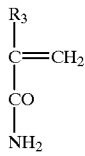

(wherein $R_3$ is as defined previously); to react with formaldehyde and/or paraformaldehyde. A compound in which $R_4$ is the organic group can be obtained by allowing a (meth)acrylamide represented by the above formula to react with formaldehyde and/or paraformaldehyde in the presence of an alcohol having a group corresponding to $R_4$ (i.e., $R_4OH$)., The (meth)acrylamide derivative may include, e.g., N-(hydroxymethyl) (meth)acrylamide; and N-(alkoxymethyl) (meth) acrylamides such as N-(methoxymethyl) (meth) acrylamide, N-(ethoxymethyl) (meth)acrylamide, N-(propoxymethyl) (meth)acrylamide and N-(butoxymethyl) (meth)acrylamide. Any of these monomers may be used alone or in the form of a mixture of two or more, depending on the properties desired for the reflection-preventing film. Of these compounds, N-(hydroxymethyl) (meth)acrylamide and N-(methoxymethyl) (meth)acrylamide are preferably used.

In addition to the structural units represented by the general formulas (1) and (2), the copolymer used in the present invention may contain an additional structural unit for the purpose of improving coating properties of the composition to be obtained and heat resistance of the reflection-preventing film to be formed.

Such an additional structural unit may include structural units derived from monomers having unsaturated multiple bonds. Such an additional structural unit is introduced into the copolymer by being copolymerized together with the compounds of the general formulas (3) and (4).

Such an unsaturated monomer may include, e.g., styrene, and substituted styrene compounds such as α-methylstyrene, o-methylstyrene, m-methylstyrene, p-methylstyrene, o-hydroxystyrene, m-hydroxystyrene, p-hydroxystyrene, o-acetoxystyrene, m-acetoxystyrene, p-acetoxystyrene and p-t-butoxystyrene; carboxylic acid vinyl ester compounds such as vinyl acetate, vinyl propionate and vinyl caproate; vinyl cyanate compounds such as (meth)acrylonitrile and α-chloroacrylontirle; unsaturated carboxylic acid ester compounds such as methyl (meth) acrylate, ethyl (meth) acrylate, n-propyl (meth)acrylate, n-butyl (meth)acrylate, n-hexyl (meth)acrylate and glycidyl (meth)acrylate; unsaturated-group-containing unsaturated carboxylic acid esters such as ethylene glycol di(meth) acrylate, propylene glycol di(meth)acrylate, vinyl (meth) acrylate, and dimethylvinylmethacryloyloxymethylsilane; halogen-containing vinyl compounds such as 2-chloroethyl vinyl ether, vinyl chloroacetate and allyl chloroacetate; hydroxyl-group-containing vinyl compounds such as 2-hydroxyethyl (meth)acrylate, 2-hydroxypropyl (meth) acrylate, N-methylol (meth)acrylamide and (meth)allyl alcohol; amido-group-containing vinyl compounds such as (meth)acrylamide and crotonic acid amide; carboxylic-group-containing vinyl compounds such as 2-methacryloyloxyethyl succinate and 2-methacryloyloxyethyl maleate; and vinylaryl compounds such as 1-vinylnathalene, 2-vinylnathalene, 9-vinylanthracene and 9-vinylcarbazole. Any of these unsaturated monomers may be used alone or in the form of a mixture of two or more.

The copolymer used in the present invention may contain the structural unit represented by the general formula (1) in an amount of from 5 to 90 mole %, preferably from 10 to 80 mole %, and more preferably from 20 to 80 mole %, and the structural unit represented by the general formula (2) in an amount of from 5 to 80 mole %, preferably from 5 to 70 mole %, and more preferably from 10 to 60 mole %, based on the total of the structural units represented by the general formulas (1) and (2) and the structural unit derived from the above additional unsaturated monomer. In the case when the structural unit derived from the additional unsaturated monomer is present, it may be contained in an amount not more than 60 mole %.

The copolymer constituting the reflection-preventing film of the present invention can be produced by a suitable process as exemplified by radical polymerization, anionic polymerization or cationic polymerization and in the polymerization form of solution polymerization or the like.

The copolymer may have a weight-average molecular weight (hereinafter "Mw") in terms of polystyrene, of usually from 2,000 to 1,000,000, preferably from 3,000 to 70,000, and particularly preferably from 5,000 to 500,000, which may appropriately be selected depending on the desired properties of the reflection-preventing film.

Solvent

The solvent constituting the composition of the present invention may include solvents capable of dissolving reflection-preventing film materials, as exemplified by ethylene glycol monoalkyl ethers such as ethylene glycol monomethyl ether, ethylene glycol monoethyl ether, ethylene glycol monopropyl ether, and ethylene glycol monobutyl ether; ethylene glycol monoalkyl ether acetates such as ethylene glycol monomethyl ether acetate, ethylene glycol monoethyl ether acetate, ethylene glycol monopropyl ether acetate, and ethylene glycol monobutyl ether acetate; diethylene glycol dialkyl ethers such as diethylene glycol dimethyl ether, diethylene glycol diethyl ether, diethylene glycol dipropyl ether, and diethylene glycol dibutyl ether; propylene glycol monoalkyl ethers such as propylene glycol monomethyl ether, propylene glycol monoethyl ether, propylene glycol monopropyl ether, and propylene glycol monobutyl ether; propylene glycol dialkyl ethers such as propylene glycol dimethyl ether, propylene glycol diethyl ether, propylene glycol dipropyl ether, and propylene glycol dibutyl ether; propylene glycol monoalkyl ether acetates such as propylene glycol monomethyl ether acetate, propylene glycol monoethyl ether acetate, propylene glycol monopropyl ether acetate, and propylene glycol monobutyl ether acetate; lactates such as methyl lactate, ethyl lactate, n-propyl lactate, isopropyl lactate, n-butyl lactate, and n-isobutyl lactate; aliphatic carboxylates such as methyl formate, ethyl formate, n-propyl formate, isopropyl formate, n-butyl formate, isobutyl formate, n-amyl formate, isoamyl formate, methyl acetate, ethyl acetate, butyl acetate, n-amyl acetate, isoamyl acetate, n-hexyl acetate, methyl propionate, ethyl propionate, n-propyl propionate, isopropyl propionate, n-butyl propionate, isobutyl propionate, methyl butyrate, ethyl butyrate, n-propyl butyrate, isopropyl butyrate, n-butyl butyrate, and isobutyl butyrate; other esters such as ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxypropyl acetate, 3-methoxybutyl acetate, 3-methyl-3-methoxybutyl acetate, 3-methyl-3-methoxybutyl propionate, 3-methyl-3-methoxybutyl butyrate, methyl acetoacetate. and methyl pyruvate; aromatic hydrocarbons such as toluene and xylene; ketones such as methyl ethyl ketone, methyl n-amyl ketone, methyl propyl ketone, methyl butyl ketone, 2-heptanone, 3-heptanone, 4-heptanone and cyclohexanone; amides such as N-methylformamide, N,N-dimethylformamide, N-methylacetamide, N,N-dimethylacetamide and N-methylpyrrolidone; and lactones such as γ-butyrolactone; any of which may be used under appropriate selection. Of these, preferred solvents are ethylene glycol monoethyl ether acetate, ethyl lactate, ethyl 3-ethoxypropionate, methyl 3-methoxypropionate, methyl n-amyl ketone, cyclohexanone and 2-heptanone. Any of these solvents may be used alone or in the form of a mixture of two or more.

The solvent may be mixed in such an mount that the solid matter concentration of the composition to be obtained may be in the range of from about 0.01 to 70% by weight, preferably from 0.05 to 60% by weight, and more preferably from 0.1 to 50% by weight.

Other Components

In the composition of the present invention, various additives may optionally be compounded so long as the desired effect of the present invention is not damaged.

Such additives may include, e.g., dyes, surface-active agents, curing agents, acid-generating agents and so forth.

The dyes may include, e.g., dyes such as oil-soluble dyes, disperse dyes, basic dyes, methine dyes, pyrazole dyes, imidazole dyes, and hydroxyazo dyes; fluorescent whitening agents such as bicucine derivatives, norbicucine, stilbene, 4,4'-diaminostilbene derivatives, coumarin derivatives, and pyrazoline derivatives; ultraviolet absorbents such as hydroxyazo dyes, TINUVIN 234 and TINUVIN 1130 (trade names, available from Ciba-Geigy Corp.); and aromatic compounds such as anthracene derivatives and anthraquinone derivatives. Any of these ultraviolet absorptive compounds may usually be compounded in an amount not more than 100 parts by weight, and preferably not more than 50 parts by weight, based on 100 parts by weight of the solid content of the reflection-preventing film-forming composition.

The surface-active agents have the action to improve coating properties, striation, wettability, developability and so forth. Such surface-active agents may include, e.g., nonionic surface-active agents such as polyoxyethylene lauryl ether, polyoxyethylene stearyl ether, polyoxyethylene oleyl ether, polyoxyethylene octyl phenyl ether, polyoxyethylene nonyl phenyl ether, polyoxyethylene glycol dilaurate, and polyoxyethylene glycol distearate; and besides, as commercially available products, e.g., an organopolysiloxane polymer KP341 (trade name, available from Shin-Etsu Chemical Co., Ltd.), (meth)acrylic acid (co) polymers POLYFLOW No.75, No.95 (trade name, available from Kyoeisha Chemical Co., Ltd.), F-TOP EF101, EF204, EF303, EF352 (trade names, available from Tohchem Products Co.), MEGAFAC F171, F172, F173 (trade names, available from Dainippon Ink & Chemicals, Incorporated), FLORADO FC430, FC431, FC135, FC93, (trade names, available from Sumitomo 3M Limited). SAHI GUARD AG710, SURFLON S382, SC101, SC102, SC103, SC104, SC105, SC106 (trade names, available from Asahi Glass Co., Ltd.). Any of these surface-active agents may usually be compounded in an amount not more than 15 parts by weight, and preferably not more than 10 parts by weight, based on 100 parts by weight of the reflection-preventing film-forming composition.

The curing agents may include, e.g. isocyanates such as tolylene diisocyanate, diphenylmethane diisocyanate, hexamethylene diisocyanate, and cyclohexane diisocyanate; epoxy resins such as EPIKOTE 812, 815, 826, 828, 834, 836, 871, 1001, 1004, 1007, 1009, 1031 (trade names, available from Yuka Shell Epoxy K.K.), ARALDYTE 6600, 6700, 6800, 502, 6071, 6084, 6097, 6099 (trade names, available from Ciba-Geigy Corp.), DER331, 332, 333, 661, 644, 667 (trade names, available from Dow Chemical); melamine type curing agents such as CYMEL 300, 301, 303, 350, 370, 771, 325, 327, 703, 712, 701, 272, 202, MICOAT 506, 508 (trade names, available from Mitsui Cyanamide Co.); benzoguanamine type curing agents such as CYMEL 1123, 1123-10, 1128, MICOAT102, 105, 106, 130 (trade names, available from Mitsui Cyanamide Co.); glycolauryl type curing agents such as CYMEL 1170, 1172 (trade names, available from Mitsui Cyanamide Co.). Any of these curing agents may usually be compounded in an amount not more than 5,000 parts by weight, and preferably not more than 1,000 parts by weight, based on 100 parts by weight of the reflection-preventing film-forming composition.

As the acid-generating agents, light acid-generating agents and heat acid-generating agents may be used.

The light acid-generating agents may include, e.g., onium salt type light acid-generating agents such as diphenyliodonium trifluoromethanesulfonate, diphenyliodonium pyrenesulfonate, diphenyliodonium dodecylbenzenesulfonate, diphenyliodonium nonafluoro-n-butanesulfonate, bis(4-t-butylphenyl)iodonium trifluoromethanesulfonate, bis(4-t-butylphenyl)iodonium dodecybenzenesulfonate, bis(4-t-butylphenyl)iodonium naphthalenesulfonate, bis(4-t-butylphenyl)iodonium hexafluoroantimonate, bis(4-t-butylphenyl)iodonium nonafluoro-n-butanesulfonate, triphenylsulfonium trifluoromethanesulfonate, triphenylsulfonium hexafluoroantimonate, triphenylsulfonium naphthalenesulfonate, triphenylsulfonium nonafluoro-n-butanesulfonate, (hydroxyphenyl)benzenemethylsulfonium toluenesulfonate, cyclohexylmethyl(2-oxocyclohexyl) sulfonium trifluoromethanesulfonate, dicyclohexyl(2-oxocyclohexyl) sulfonium trifluoromethanesulfonate, dimethyl(2-oxocyclohexyl)sulfonium trifluoromethanesulfonate, diphenyliodonium hexafluoroantimonate, triphenylsulfonium camphorsulfonate, (4-hydroxyphenyl)benzylmethylsulfonium toluenesulfonate, 1-naphthyldimethylsulfonium trifluoromethanesulfonate, 1-naphthyldlethylsulfonium trifluoromethanesulfonate, 4-cyano-1-naphthyldimethylsulfonium trifluoromethanesulfonate, 4-nitro-1-naphthyldimethylsulfonium trifluoromethanesulfonate, 4-methyl-1-naphthyldimethylsulfonium trifluoromethanesulfonate, 4-cyano-1-naphthyldiethylsulfonium trifluoromethanesulfonate, 4-nitro-1-naphthyldiethylsulfonium trifluoromethanesulfonate, 4-methyl-1-naphthyldiethylsulfonium trifluoromethanesulfonate, 4-hydroxy-1-naphthyldimethylsulfonium trifluoromethanesulfonate, 4-hydroxy-1-naphthyltetrahydrothiophenium trifluoromethanesulfonate, 4-methoxy-1-naphthyltetrahydrothiophenium trifluoromethanesulfonate, 4-ethoxy-1-naphthyltetrahydrothiophenium trifluoromethanesulfonate, 4-methoxymethoxy-1-naphthyltetrahydrothiophenium trifluoromethanesulfonate, 4-ethoxymethoxy-1-naphthyltetrahydrothiophenium trifluoromethanesulfonate, 4-(1-methoxyethoxy)-1-naphthyltetrahydrothiophenium trifluoromethanesulfonate, 4-(2-methoxyethoxy)-1-naphthyltetrahydrothiophenium trifluoromethanesulfonate, 4-methoxycarbonyloxy-1-naphthyltetrahydrothiophenium trifluoromethanesulfonate, 4-ethoxycarbonyloxy-1-naphthyltetrahydrothiophenium trifluoromethanesulfonate, 4-n-propoxycarbonyloxy-1-naphthyltetrahydrothiophenium trifluoromethanesulfonate, 4-i-propoxycarbonyloxy-1-naphthyltetrahydrothiophenium trifluoromethanesulfonate, 4-n-butoxycarbonyloxy-1-naphthyltetrahydrothiophenium trifluoromethanesulfonate, 4-t-butoxycarbonyloxy-1-naphthyltetrahydrothiophenium trifluoromethanesulfonate, 4-(2-tetrahydrofuranyloxy)-1-naphthyltetrahydrothiophenium trifluoromethanesulfonate, 4-(2-tetrahydropyranyloxy)-1-naphthyltetrahydrothiophenium trifluoromethanesulfonate, 4-benzyloxy-1-naphthyltetrahydrothiophenium trifluoromethanesulfonate, and 1-(naphthylacetomethyl)tetrahydrothiophenium trifluoromethanesulfonate; halogen-containing compound type light acid-generating agents such as phenyl-bis(trichloromethyl)-s-triazine, methoxyphenyl-bis(trichloromethyl)-s-triazine, and naphthyl-bis (trichloromethyl)-s-triazine; diazoketone type light acid-generating agents such as 1,2-naphthoquinonediazido-4-sulfonyl chloride, 1,2-naphthoquinonediazido-5-sulfonyl chloride, and 1,2-naphthoquinonediazido-4-sulfonic acid ester or 1,2-naphthoquinonediazido-5-sulfonic acid ester of 2,3,4,4'-tetrabenzophenone; sulfonic acid compound type light acid-generating agents such as 4-trisphenacylsulfone, mesitylphenacylsulfone, bis(phenylsulfonyl)methane, benzoin tosylate, tristrifluoromethanesulfonate of pyrrogalol, nitrobenzyl-9,10-diethoxyanthracene-2-sulfonate, trifluoromethanesulfonylbicyclo[2,2,1]hepto-5-ene-2,3-dicarbodiimide, N-hydroxysuccinimide trifluoromethanesulfonate. and 1,8-naphthalenedicarboxylic acid imide trifluoromethanesulfonate.

The heat acid-generating agents may include, e.g., 2,4,4,6-tetrabromocyclohex-3,5-dienone, benzoin tosylate, 2-nitrobenzyl tosylate, and alkylsulfonates.

Any of these acid-generating agents may usually be compounded in an amount not more than 5,000 parts by weight, and preferably from 0.1 part by weight to 1,000 parts by weight, based on 100 parts by weight of the solid content of the reflection-preventing film-forming composition.

As additives other than the foregoing, they may also include storage stabilizers, anti-foaming agents and adhesives.

How to Use the Composition

When a patterned resist film is formed, the composition of the present invention is used, e.g., in the following way: The patterned resist film is formed by a process comprising the steps of 1) coating the reflection-preventing film-forming composition on a substrate, followed by baking to form a reflection-preventing film, 2) coating a resist composition on the reflection-preventing film, followed by baking to form a resist film, 3) irradiating the resist film with a radiation through an exposure mask, 4) developing the resist film irradiated with radiations, and 5) etching the reflection-preventing film.

Stated specifically, to form the patterned resist film (resist pattern), in the first step, the reflection-preventing film-forming composition is coated on a substrate so as to be in a prescribed layer thickness, e.g., from 100 to 5,000 angstroms, by a process such as spin coating, cast coating or roll coating. Next, the coated reflection-preventing film-forming composition is baked to make it heat-cure. Here, the baking temperature may be, e.g., about 90 to 350° C.

A reflection-preventing film is formed on the substrate in the manner described above, and thereafter, in the second step, a resist composition is coated on the reflection-preventing film so that the resulting resist film may have a prescribed layer thickness, followed by prebaking to volatilize the solvent in the resist film, thus a dried resist film is formed. The temperature of this prebaking is appropriately controlled depending on the type of the resist used, and may usually be from about 30 to 200°, and preferably from 50 to 150° C.

When the resist film is formed, the resist may be dissolved in a suitable solvent so as to be in a solid matter concentration of, e.g., from 5 to 50% by weight, followed by filtration with a filter of, e.g., about 0.2 μm in pore size to prepare a solution, and this solution is coated on the reflection-preventing film on the substrate by the process such as spin coating, cast coating or roll coating; the substrate being exemplified by a silicon wafer or a waver covered with aluminum. In this case, any commercially available resist solutions may be used as they are.

The resist used to form the the resist pattern in the present invention may include, e.g., positive resists comprising an alkali-soluble resin and a quinone diazide photosensitive material, negative resists comprising an alkali-soluble resin and a radiation-sensitive cross-linking agent, and positive or negative chemically amplifiable resists containing a radiation-sensitive acid generating agent.

Thereafter, in the third step, the resist film is irradiated by radiations (hereinafter exposure) through an exposure mask.

Suitable radiations such as visible light radiations, ultraviolet radiations, far-ultraviolet radiations, X-radiations, electron radiations, gamma radiations, molecular radiations and ion beams may be used depending the type of the resist. Of these radiations, preferred are far-ultraviolet radiations. In particular, a KrF excimer laser (248 nm) and am ArF excimer laser (193 nm) are preferably used for the composition of the present invention.

Next, in the fourth step, the resist film thus exposed is developed, followed by washing and then drying to form the desired resist pattern. In this step, the resist film may be baked after the exposure and before the development so that the resolution, pattern shape and developability can be improved. Finally, in the fifth step, the reflection-preventing film is dry-etched with gas plasma such as oxygen plasma, using the resist pattern as a mask, thus a resist pattern for processing substrates is obtained.

The developer used to form the resist pattern in the present invention may include, e.g., aqueous alkali solutions prepared by dissolving sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo-(5,4,0)-7-undecane or 1,5-diazabicyclo-(4,3,0)-5-nonane in water. To these developers, a water-soluble organic solvent, e.g., an alcohol such as methanol or ethanol and a surface-active agent may be added in appropriate quantity.

EXAMPLES

The present invention will be described below in greater detail by giving Examples. It, however, should be noted that the present invention is not limited to these Examples. In the following description, "part(s)" refers to "part(s) by weight" unless particularly noted.

The resist used in the following Examples and Comparative Examples is a positive resist for KrF (trade name: KrF K2G; available from JSR Corporation).

Performance evaluation of reflection-preventing film-forming compositions is made in the following way.

Sublimation Properties:

The reflection-preventing film-forming composition is spin-coated on the surface of a silicon wafer of 4 inches diameter, and then baked at 90° C. for 1 minute on a hot plate to form a reflection-preventing film with a layer thickness of 0.1 µm. Next, above the silicon wafer on which this reflection-preventing film has been formed, a different silicon wafer having the same size is disposed in parallel, leaving a space of 1 cm between them. In this state, the silicon wafer on which the first reflection-preventing film has been formed is further baked at 200° C. for 2 minutes. Thereafter, visually examined is whether or not any sublimate from the first-sheet wafer has condensed and deposited on the bottom-side surface of the silicon wafer disposed above the former. Sublimation properties of the reflection-preventing film-forming composition are judged by whether or not any condensate has adhered.

Resolution:

The reflection-preventing film-forming composition is spin-coated on a silicon wafer of 4 inches diameter, and then baked at 90° C. for 1 minute and at 200° C. for 2 minutes on a hot plate to form a reflection-preventing film with a layer thickness of 0.1 µm. Thereafter, a resist is spin-coated on the reflection-preventing film so as to provide a resist film in a layer thickness of 0.7 µm, followed by baking for 2 minutes on a 80° C. hot plate to form a resist film, Next, using a stepper NSR2005EX8A (wavelength: 248 nm), manufactured by Nikon K.K., the resist film is exposed to light at the center of a hole pattern, for an exposure time only necessary for forming a 0.5 µm wide line-and-space pattern at a line width of 1:1 (hereinafter "optimum exposure time"). Subsequently, the resist film thus exposed is baked for 2 minutes on a 100° C. hot plate, and thereafter developed at 25° C. for 1 minute with an aqueous 2.38% by weight tetramethylammonium hydroxide solution, followed by water washing and drying to form a resist pattern. The minimum line width of the resist pattern resolved is measured with a scanning electron microscope.

Intermixing-preventing Effect:

The reflection-preventing film and resist film are formed, exposed and developed in the same manner as in the evaluation of resolution. The extent of trailing of the resist film at its points coming into contact with the reflection-preventing film at the part removed by the development of the resist film is examined with a scanning electron microscope.

Standing-wave-preventing Effect:

The reflection-preventing film and resist film are formed, exposed and developed in the same manner as in the evaluation of resolution. Thereafter, whether or not any standing wave has affected the resist film is examined with a scanning electron microscope.

Etching rate:

The reflection-preventing film and resist film are formed, exposed and developed in the same manner as in the evaluation of resolution. Thereafter, dry etching by oxygen plasma (pressure: 15 Pa; RF power: 300 W; etching gas: oxygen) is carried out, and the etching rate of the reflection-preventing film is measured to determine the ratio of etching rates between the reflection-preventing film and resist film (reflection-preventing film etching rate/resist film etching rate).

Synthesis Example 1 (Synthesis of monomer)

In a separable flask having a thermometer, 80 parts of 9-anthracene methanol, 55 parts of triethylamine and 500 parts of propylene glycol monomethyl ether were added, the mixture obtained was cooled to 10° C. or below, and 58 parts of methacryloyl chloride was added dropwise gradually, followed by stirring at 10° C. or below for 20 hours. Thereafter, the contents of the flask were poured into water, and 1,000 parts of ethyl acetate was added to make extraction, followed by removal of the solvent. The solid thus obtained was recrystallized in a 2:1 mixed solvent of n-hexane and toluene to obtain a 9-anthracene methanol methacrylic ester monomer represented by the following chemical structural formula.

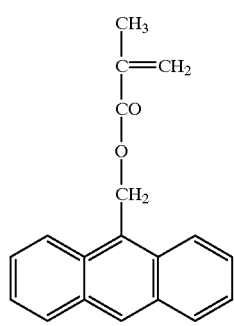

Polymerization Example 1

In a separable flask having a thermometer and a condenser, 20 parts of the monomer obtained in Synthesis Example 1, 9.4 parts of hydroxyethyl methacrylate, 2 parts of N-(hydroxymethyl) acrylamide, 0.6 part of azobisisobutyronitrile and 500 parts of propylene glycol monomethyl ether were added, and then stirred at 80° C. for 8 hours with nitrogen bubbling. Thereafter, the contents of the flask were poured Into water, and the resin precipitated was dried at 40° C. overnight by means of a vacuum dryer.

Weight-average molecular weight (in terms of polystyrene) of the resin thus obtained was measured by gel permeation chromatography and was found to be 10,000.

Its infrared absorption spectrum was also measured to obtain the results shown in FIG. 1.

Figure 2:
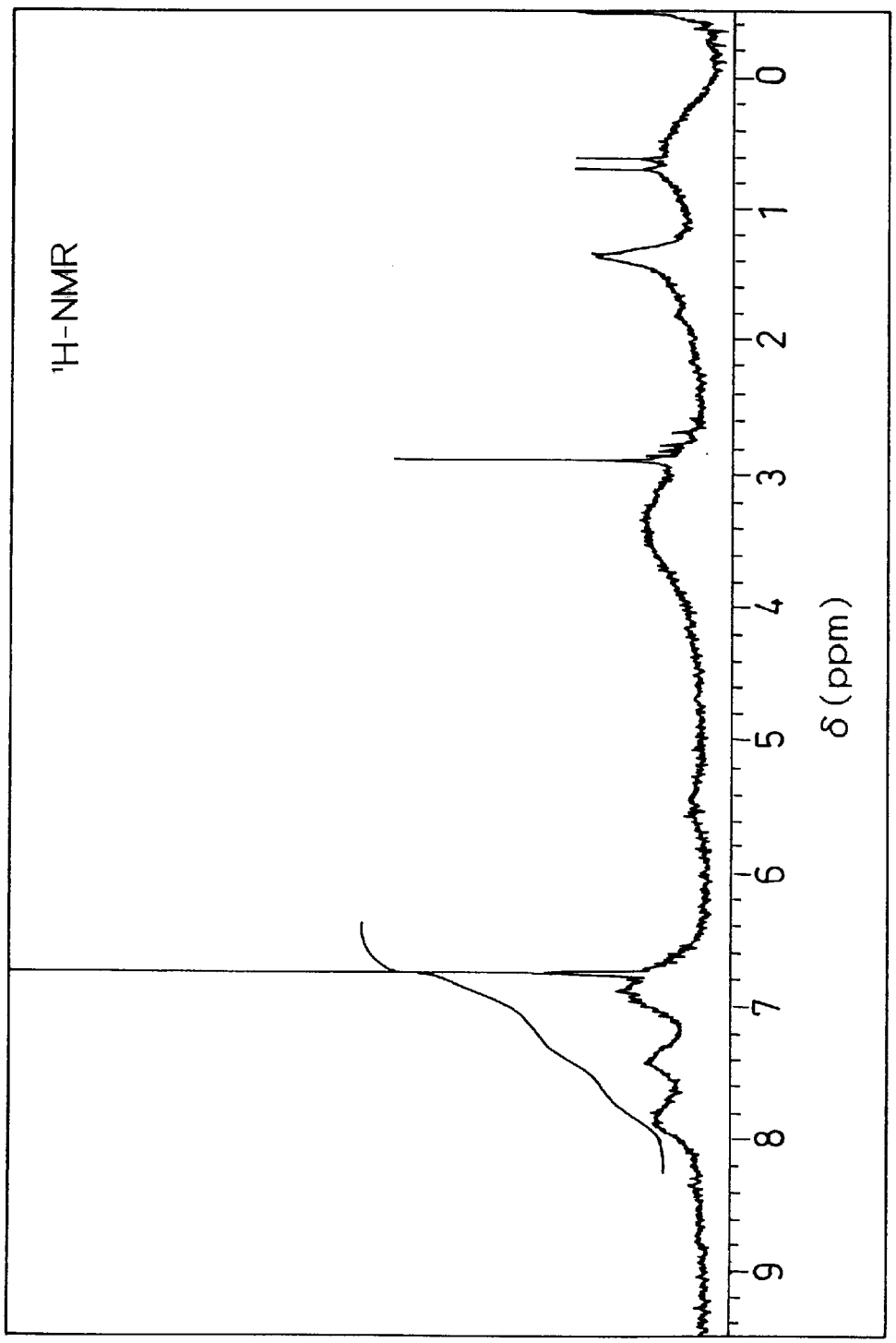
FIG. 2 shows a $^1$H-NMR spectrum of the copolymer.

$^1$H-NMR was also measured to obtain the results shown in FIG. 2.

From the foregoing results, the resin was confirmed to be a copolymer having the following structure, in which 9-anthracene methanol methacrylic ester, hydroxyethyl methacrylate and N-(hydroxymethyl) acrylamide were copolymerized in a molar ratio of 4:4:1.

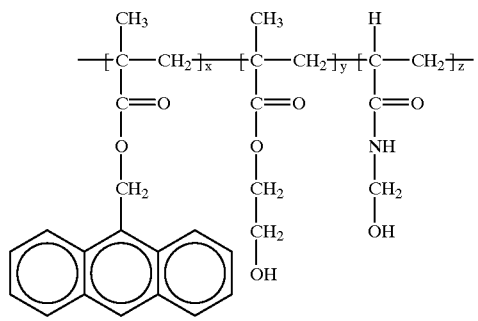

Wherein x, y and z stand for the numbers of the structural units to which they are appended, respectively, and the proportion x:y:z is 4:4:1.

Polymerization Example 2

A resin having Mw of 10,000 (in terms of polystyrene) was obtained in the same manner as in Example 1 except that 9.4 parts of hydroxyethyl methacrylate used therein was replaced with 6.2 parts of methacrylic acid.

From the results of $^1$H-NMR, the resin was confirmed to be a copolymer having a structure in which 9-anthracene methanol methacrylic ester, methacrylic acid and N-(hydroxymethyl) acrylamide were copolymerized in a molar ratio of 4:4:1.

Polymerization Example 3

In a separable flask having a thermometer and a condenser, 50 parts of the monomer obtained in Synthesis Example 1, 9.4 parts of hydroxyethyl methacrylate, 5.5 parts of acenaphthylene, 7.3 parts of N-(hydroxymethyl) acrylamide, 1.4 parts of azobisisobutyronitrile and 500 parts of propylene glycol monomethyl ether were added, and then stirred at 80° C. for 8 hours with nitrogen bubbling. Thereafter, the contents of the flask were poured into water, and the resin precipitated was dried at 40° C. overnight by means of a vacuum dryer. The resin thus obtained had Mw of 15,000 (in terms of polystyrene) and, from the results of $^1$H-NMR, was confirmed to be a copolymer having a structure in which 9-anthracene methanol methacrylic ester, hydroxyethyl methacrylate, acenaphthylene and N-(hydroxymethyl) acrylamide were copolymerized in a molar ratio of 5:2:1:2.

Examples 1 to 3

Using the resins obtained in Examples 1 to 3, three kinds of reflection-preventing film-forming compositions were prepared in the following way.

In 90 parts of ethyl lactate, 5 parts of each resin and 0.5 part of bis(4-t-butylphenyl)iodonium camphorsulfonate were dissolved, followed by filtration with a membrane filter of 0.2 μm in pore diameter, thus the compositions were prepared.

Next, on the compositions thus obtained, resist patterns were formed and the reflection-preventing film performance was evaluated in the manner as described above. The results of evaluation are shown in Table 1.

TABLE 1

| | Sublimation properties | Resolution (μm) | Intermixing-preventing effect | Standing-wave-preventing effect | Etching rate ratio |
|---|---|---|---|---|---|
| Example 1 | None | 0.22 | No trailing | No standing waves | 3.0 or more |
| Example 2 | None | 0.22 | No trailing | No standing waves | 3.0 or more |
| Example 3 | None | 0.22 | No trailing | No standing waves | 3.0 or more |

What is claimed is:

1. A copolymer having structural units represented by the following general formulas (1) and (2):

(1)

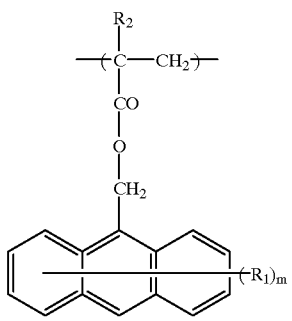

wherein $R_1$ represents a hydrogen atom, a halogen atom, a hydrocarbon group having 1 to 6 carbon atoms, a nitro group, a primary amino group, a hydroxyl group, an acyl group, a carboxyl group, a sulfone group or a mercapto group, and, when present in plurality, $R_1$'s are the same or different; $R_2$ represents a hydrogen atom or a methyl group; and m represents an integer of 1 to 9;

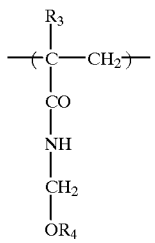
(2)

wherein $R_3$ represents a hydrogen atom or a methyl group, and $R_4$ represents a hydrogen atom or an organic group.

2. The copolymer of claim 1, wherein the structural unit represented by the general formula (1) is present in an amount of from 5 to 90 mole % and the structural unit represented by the general formula (2) is present in an amount of from 5 to 80 mole %, based on the total of the structural units contained in the molecule.

3. The copolymer of claim 2, wherein the structural unit represented by the general formula (1) is present in an amount of from 10 to 80 mole % and the structural unit represented by the general formula (2) is present in an amount of from 5 to 70 mole %, based on the total of the structural units contained in the molecule.

4. The copolymer of claim 1, which further comprises a structural unit derived from a monomer having an unsaturated multiple bond, and other than the structural units represented by the general formulas (1) and (2).

5. The copolymer of claim 4, wherein said structural unit other than the structural units represented by the general formulas (1) and (2) is present in an amount not more than 60 mole % based on the total of the structural units contained in the molecule.

6. The copolymer of claim 1, which has a weight-average molecular weight in terms of polystyrene, of from 2,000 to 1,000,000.

7. The copolymer of claim 1, which has a weight-average molecular weight in terms of polystyrene, of from 3,000 to 700,000.

8. A reflection-preventing film-forming composition comprising the copolymer described in claim 1 and a solvent.

9. The composition of claim 8, wherein said solvent is selected from the group consisting of ethylene glycol monoethyl ether acetate, ethyl lactate, ethyl 3-ethoxypropionate, methyl 3-methoxypropionate, methyl n-amyl ketone, cyclohexanone and 2-heptanone.

10. The composition of claim 8, wherein said solvent is present in such amounts that said composition has a solid matter concentration in the range from 0.1 to 70% by weight.

11. The composition of claim 8, wherein said solvent is present in such amounts that said composition has a solid matter concentration in the range from 0.05 to 60% by weight.

12. The composition of claim 8, which further comprises a member selected from the group consisting of a dye, a surface-active agent. a curing agent and an acid-generating agent.

13. A process comprising the steps of 1) coating the reflection-preventing film-forming composition as defined in claim 8, on a substrate, followed by baking to form a reflection-preventing film, 2) coating a resist composition on the reflection-preventing film, followed by baking to form a resist film, 3) irradiating the resist film with a radiation through an exposure mask, 4) developing the resist film irradiated by radiations, and 5) etching the reflection-preventing film.

* * * * *